Nov. 30, 1965 C. HILSUM 3,221,218

HIGH FREQUENCY SEMICONDUCTOR DEVICES AND CONNECTIONS THEREFOR

Filed June 14, 1962 2 Sheets-Sheet 1

Inventor
Cyril Hilsum
By Cushman, Darby & Cushman
Attorneys

Nov. 30, 1965 C. HILSUM 3,221,218

HIGH FREQUENCY SEMICONDUCTOR DEVICES AND CONNECTIONS THEREFOR

Filed June 14, 1962 2 Sheets-Sheet 2

Inventor
Cyril Hilsum

By Cushman, Darby & Cushman
Attorneys

United States Patent Office 3,221,218

Patented Nov. 30, 1965

3,221,218

HIGH FREQUENCY SEMICONDUCTOR DEVICES AND CONNECTIONS THEREFOR

Cyril Hilsum, Hitchin, England, assignor to National Research Development Corporation, London, England, a British corporation Filed June 14, 1962, Ser. No. 202,420
5 Claims. (Cl. 317—234)

This invention is concerned with the production of semiconductor devices, and one object of the invention is to provide a device which, although necessarily very small, is nevertheless mechanically strong and has firm and reliable electrical contacts where required within the device and outside it for connections into external circuits in which it is to be operated, even though the areas available for making such contacts may be extremely small.

A further object is to reduce the electrical capacitances, so as to ensure its satisfactory operation at high radio frequencies, without weakening the mechanical structure, and another object is to simplify its construction so as to facilitate the use of modern production methods.

The accompanying diagrammatic drawings and the following description will enable the excellent properties of the improved structure to be appreciated and to be distinguished from what has so far been the accepted practice. The drawings are greatly enlarged sectional views of various constructions of semiconductor diodes as described below.

Figure 1:
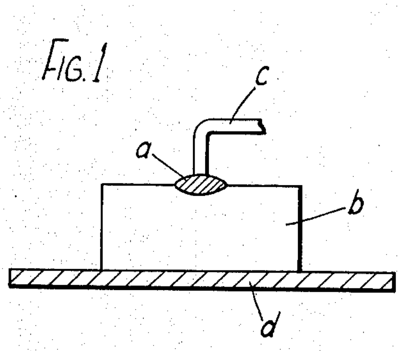
FIGURE 1 shows a conventional manner of constructing semiconductor devices.
Figure 2:
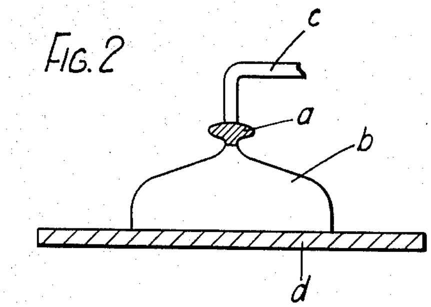
FIGURE 2 shows an advanced phase of the process of FIGURE 1.

One of the problems in making semiconductor devices is that they are very small, and the contact areas are minute. In high frequency semiconductor diodes, such as the tunnel (or Esaki) diode and the variable capacitance diode, the conventional method of manufacture, illustrated in FIG. 1 of the drawings is to alloy a metal pellet (*a*) less than 0.1 mm. in diameter on to the surface of a slice of semiconductor (b) to produce a P-N junction. An electrical contact (*c*) must then be made to the pellet (*a*) another ohmic contact (*d*) is provided to the semiconductor slice (*b*). If the diode is to operate at frequencies above 1 kmc./s., the capacity of the junction, and hence its area, must be small, and typical areas used are less than $10^{-5}$ square centimetres. Such small areas are obtained by etching the junction after the metal pellet has been alloyed, and the resulting structure is then as shown in FIG. 2 with the active region resting on a tiny pinnacle, which is very fragile. Besides the junction region being mechanically weak, it is difficult to make reliable contact to the small metal pellet, which is often less than 5 mils in diameter.

Figure 3:
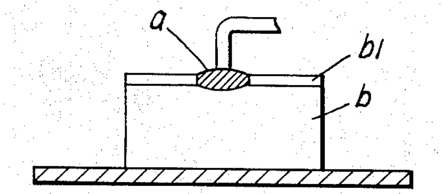
FIGURE 3 shows another prior art manner of constructing semiconductor devices.
Figure 4:
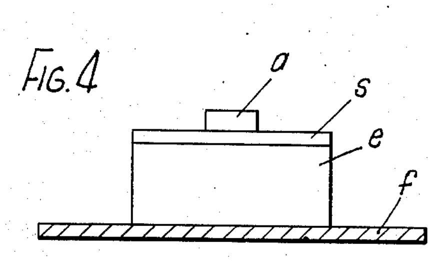
FIGURE 4 shows a stage of the present invention.
Figure 5:
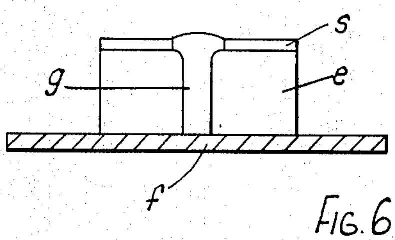
FIGURE 5 shows a further stage of the present invention.
Figure 6:
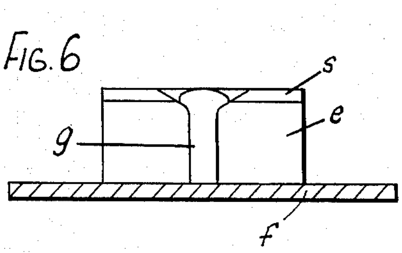
FIGURE 6 shows a still further stage of the present invention.
Figure 7:
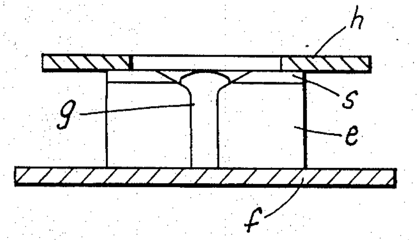
FIGURE 7 shows a still further stage of the present invention.

An alternative method for making tunnel diodes, illustrated in FIG. 3, is to use a semiconductor (*b*) of say N-type conductivity with a thin layer ($b^1$) on it of opposite type conductivity and if a pellet (*a*) is now alloyed into the P-type layer with a metal contact (*c*) as before, the tunnelling region is of cylindrical shape but would not have a satisfactory electrical performance, since there would be large unwanted capacitances, and there is still the same difficulty in making firm contact to the small area of the pellet.

The production of the new improved structure is illustrated in FIGS. 4 to 7. The basis of the diode to be made is a slice of semi-insulating gallium arsenide (*e*). This form of gallium arsenide has a very high resistivity and can be prepared by floating-zone refining of the normal semiconducting gallium arsenide or by heating semiconducting gallium arsenide in an oxygen atmosphere at 1100° C. for 12 hours. The resistivity of the semi-insulating form at room temperature is between $10^6$ and $10^9$ ohm. cm., and for many purposes the material can be considered as an insulator. However, it has the same crystal structure as semiconducting gallium arsenide so that semiconducting gallium arsenide can be deposited epitaxially on the semi-insulating gallium arsenide. After the semiconducting gallium arsenide is deposited on the semi-insulating gallium arsenide, a monocrystal is formed, the semi-insulating gallium arsenide comprising one portion thereof and the semiconducting gallium arsenide comprising the remaining portion thereof—each portion being crystallographically connected to the other.

The epitaxial deposition can be done either by vapour deposition or liquid deposition. When using vapour deposition a source of gallium arsenide, containing a doping agent if necessary to give the required conductivity type semiconductor is kept at 800° C. and allowed to react with iodine vapour (or another halogen can be used) and the products of the reaction are allowed to pass over the semi-insulating gallium arsenide which is kept at 700° C. At this temperature a reverse reaction occurs and the semiconducting gallium arsenide is deposited on the semi-insulating slice. Liquid deposition can be done by dissolving the semiconductor in a solute (gallium is a suitable solvent for gallium arsenide) at a high temperature to obtain a saturated solution which flows on to the semi-insulating slice and is allowed to cool slowly so that the dissolved semiconductor is recrystallised on to the slice.

In either of these ways a skin (*s*) of semiconducting gallium arsenide is formed on the slice (*e*) of semi-insulating gallium arsenide, the skin (*s*) being doped with zinc, for example, to make the surface layer or skin into P-type material. The slice (*e*) is mounted on a metal disc (*f*) which constitutes one external contact of the completed device, and a metal pellet (*a*) for making an alloyed P-N junction with the skin (*s*) is placed on the surface skin. The alloying pellet must convert the P-type material locally into N-type material, and suitable metals are tin, antimony-tin, or other host metals containing elements from Groups IV or VI of the periodic table. The pellet is heated to alloy it with the skin (*s*) and the heating is continued until the metal of the pellet extends as a sort of stalk through the slice (*e*) into contact with the metal disc (*f*) on which it is mounted. The passage of the metal through the slice can be assisted by choosing a favourable crystal orientation for the slice, or by inducing lines of dislocation in the slice, e.g. by ultrasonic machining, or by heating the metal pellet by an electric current, or by discharging a charged capacitor between the pellet and the slice or by a combination of these methods. A preferable way, of course, is to bore a small hole through the skin and through the semi-insulating slice (*e*) to allow some of the metal of the pellet to run through when molten. After the pellet is caused to make an electrical connection through the semi-insulating slice (*e*), a unitary electrical conductor is formed which extends through the monocrystal (comprising semi-insulating layer (*e*) and semiconducing skin (*s*)).

Figure 8:
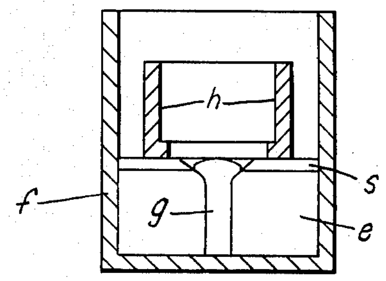
FIGURE 8 shows a modified embodiment of the present invention.

The contact to the P-N junction is now a stalk or thin cylinder (*g*) of metal, e.g. tin, but it is quite firm and rigid because it is surrounded and supported by the semi-insulating gallium arsenide (*e*). The active area can be reduced by etching to give the result illustrated in FIG. 6, but the structure never becomes fragile. A metal ring contact or electrical conducting phate (*h*) is provided on top of the skin (*s*) as in FIG. 7, the other external contact of the device is the metal disc or electrical conductivity plate (*f*) on which the slice (*e*) is mounted. Both external contacts (*f*) and (*h*) may be made of cylindrical shape as illustrated in FIG. 8 to make a coaxial structure for fitting into a coaxial line.

The slice (*e*) must be of high resistivity material, otherwise there would be an electrical contact to the large area of the skin (*s*), and the completed device would have a large capacitance. Here the slice is electrically inactive and serves only as a support for the skin and the stalk contact (*g*).

Figure 9:
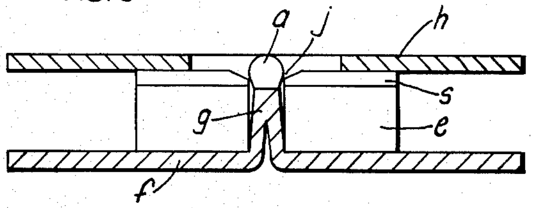
FIGURE 9 shows a further modification of the present invention.

The preferred construction of diode now being used is that illustrated in the enlarged section shown in FIG. 9 which gives a very satisfactory performance and is suitable for mass production.

In making this diode, a slice of semi-insulating gallium arsenide has a degenerate skin of semiconducting gallium arsenide formed on it by epitaxial deposition as above described, with zinc as the doping agent for P-type conductivity skin. The diode has the shape of a ring or annulus which is cut from the slice by ultrasonic technique. The base contact is a gold plated molybdenum disc (*f*) with a thin spike or stalk (*g*) 8 mils long and 8 mils in diameter formed in it by impact extrusion and the ring (*e*) of gallium arsenide is fitted over the spike (*g*) and alloyed to the disc (*f*), the epitaxial skin (*s*) being on the surface left exposed. Electrical contact between the disc (*f*) and the semi-insulating ring (*e*) is not necessary. The top of the spike (*g*) now lies just below the exposed surface of the gallium arsenide ring, so that the P-N junction and contact to the base can be made simultaneously by alloying to the skin (*s*) and the top of the spike a pellet (*a*) of tin placed on the spike. A ring (*h*) of gold plated molybdenum, alloyed to the skin, forms the top contact. The active area of the junction is reduced by etching, by an electrolytic process using large current pulses of short duration so as to produce the required profile as illustrated at (*j*) in the section of FIG. 9.

One particularly important advantage of diodes made in this way is that the cooling which follows the formation of the junction will be rapid since the tin pellet is connected through the spike to a good heat sink with the result that the junctions so made are much more abrupt than those made on material of similar impurity concentration by the conventional method, the abrupt junction being particularly desirable for highest efficiency.

In the diodes which have been made in the way described above, the epitaxial skin is about 100 microns thick, the whole structure being about 0.5 mm. in thickness and 2.5 mm. in overall diameter.

The structure of the completed diode is convenient for use in coaxial lines, strip lines or cavities, and the performance is suitable for application as high frequency oscillators. The diodes can also be used as switches provided that they are not driven hard into the thermal current region.

The devices have good mechanical stability, low inductance and suitability for mass production. The electrical characteristics are at least as good as those of conventional diodes, and in several respects are superior. The constructional technique is suitable for other semiconductor devices where a small capacitance or small junction area are required, such as, for example, switching diodes or reactance diodes.

Because germanium can be deposited epitaxially on semi-insulating gallium arsenide it is also possible to construct in this way devices in which germanium is the semiconductor.

I claim:

1. A high frequency semiconductor device comprising:

(1) a monocrystal element having at least one first face and at least one second face and a first portion having a resistivity greater than $10^6$ ohm. cm. adjacent said first face and a second portion, having a resistivity substantially less than said first portion and a conductivity of one type, adjacent said second face and being crystallographically connected with said first portion;

(2) an electrical conductor extending through said monocrystal element intersecting said first and second faces, having a resistivity less than said second portion of said monocrystal element and including a mass of metal at the end adjacent said second portion alloyed to the adjacent surrounding surface of said second portion and forming a portion of material in said second portion of opposite conductivity type to that of said second portion, a P-N junction between said portion and said second portion having an area less than $10^{-5}$ square centimeters;

(3) a first conducting plate, having a resistivity substantially that of said electrical conductor, being in electrical contact with said second portion of said second semiconductor; and (4) a second conducting plate, having a resistivity substantially that of said electrical conductor, being in electrical contact with said electrical conductor and in physical contact with said first face of said monocrystal element.

2. A device as in claim 1 in which said first and second portions of said monocrystal element are gallium arsenide.

3. A device as in claim 1 in which said first portion of said monocrystal element is a compound of gallium and arsenic and said second portion is a semiconductor material comprising at least one other element.

4. A device as in claim 1 in which said monocrystal element and said first plate are annular.

5. A device as in claim 1 in which said electrical conductor is an integral part of said second conducting plate.

References Cited by the Examiner

UNITED STATES PATENTS

| | | | |
|---|---|---|---|
| 2,854,365 | 9/1958 | Matare | 317—235 |
| 2,894,183 | 7/1959 | Fermanian | 317—235 |
| 2,979,427 | 4/1961 | Shockley | 317—235 |
| 3,008,089 | 11/1961 | Uhlir | 317—235 |
| 3,063,023 | 11/1962 | Dacey et al. | 317—235 |
| 3,072,507 | 1/1963 | Anderson et al. | 317—235 |

FOREIGN PATENTS 719,873 12/1954 Great Britain.

OTHER REFERENCES

Electronics Buyer's Guide, June 1958-Midmonth, "Semiconductor Compounds Open New Horizons," by Abraham Coblenz, page R–4.

"Properties of Elemental and Compound Semiconductors," edited by Harry C. Gatos, Intersecience Publishers, Inc., copyright 1960, "Materials Research on GaAs and InP," by Weisberg et al., Section 4.2, pages 37, 38, 39 and 40.

RCA Technical Notes, June 1960, RCA TN #372, "Production Of High Resistivity Gallium Arsenide," by Weisberg et al.

DAVID J. GALVIN, *Primary Examiner.*

JAMES D. KALLAM, *Examiner.*